(12) United States Patent
Plett (10) Patent No.: US 7,994,755 B2
(45) Date of Patent: Aug. 9, 2011

(54) SYSTEM, METHOD, AND ARTICLE OF MANUFACTURE FOR DETERMINING AN ESTIMATED BATTERY CELL MODULE STATE

(75) Inventor: Gregory L. Plett, Colorado Springs, CO (US)

(73) Assignee: LG Chem, Ltd. (KR)

( * ) Notice: Subject to any disclaimer, the term of this patent is extended or adjusted under 35 U.S.C. 154(b) by 395 days.

(21) Appl. No.: 12/022,277

(22) Filed: Jan. 30, 2008

(65) Prior Publication Data

US 2009/0189613 A1 Jul. 30, 2009

(51) Int. Cl.
*H02J 7/00* (2006.01)
*H02J 7/04* (2006.01)
*H02J 7/16* (2006.01)

(52) U.S. Cl. ........ 320/132; 320/133; 320/134; 320/150; 320/155; 320/161

(58) Field of Classification Search .................. 320/132, 320/133, 134, 135, 136, 137, 148, 149, 150, 320/151, 152, 155, 156, 157, 159; 324/426, 324/427, 428
See application file for complete search history.

(56) References Cited

U.S. PATENT DOCUMENTS

| | | | |
|---|---|---|---|
| 4,390,841 A | 6/1983 | Martin et al. | |
| 5,606,242 A | 2/1997 | Hull et al. | |
| 5,652,502 A | 7/1997 | van Phuoc et al. | |
| 5,658,682 A | 8/1997 | Usuda et al. | |
| 5,773,955 A * | 6/1998 | Hall | 320/104 |
| 5,796,239 A | 8/1998 | van Phuoc et al. | |
| 5,825,155 A | 10/1998 | Ito et al. | |
| 5,982,403 A | 11/1999 | Inagaki | |
| 6,016,047 A | 1/2000 | Notten et al. | |
| 6,353,815 B1 | 3/2002 | Vilim et al. | |
| 6,441,586 B1 * | 8/2002 | Tate et al. | 320/132 |
| 6,515,454 B2 | 2/2003 | Schoch | |
| 6,534,954 B1 | 3/2003 | Plett | |
| 6,563,318 B2 | 5/2003 | Kawakami et al. | |
| 6,724,172 B2 | 4/2004 | Koo | |
| 6,803,766 B2 * | 10/2004 | Kobayashi et al. | 324/434 |
| 6,829,562 B2 | 12/2004 | Sarfert | |
| 6,832,171 B2 | 12/2004 | Barsoukov et al. | |
| 6,876,175 B2 | 4/2005 | Schoch | |
| 6,892,148 B2 | 5/2005 | Barsoukov et al. | |

(Continued)

OTHER PUBLICATIONS

"A Review of Cell Equalization Methods for Lithium Ion and Lithium Polymer Battery Systems" Stephen W. Moore and Peter J. Schneider; 2001 Society of Automotive Engineers; Jan. 2001; pp. 1-5.

(Continued)

*Primary Examiner* — Edward Tso
*Assistant Examiner* — Alexis Boateng
(74) *Attorney, Agent, or Firm* — Cantor Colburn LLP (57) ABSTRACT

A system, a method, and an article of manufacture for determining an estimated battery cell module state indicative of a state of a battery cell module of a battery pack are provided. The method includes measuring at least one of a battery cell module voltage, a battery cell module current, and a battery cell module temperature. The method further includes determining the estimated battery cell module state of the battery cell module at a predetermined time based on an estimated battery pack state and at least one of the battery cell module voltage, the battery cell module current, and the battery cell module temperature. The method further includes storing a vector corresponding to the estimated battery cell module state in a memory.

6 Claims, 2 Drawing Sheets

U.S. PATENT DOCUMENTS

| | | | |
|---|---|---|---|
| 6,903,534 B2 * | 6/2005 | Minamiura | 320/150 |
| 6,927,554 B2 | 8/2005 | Tate, Jr. et al. | |
| 6,943,528 B2 | 9/2005 | Schoch | |
| 6,967,466 B2 | 11/2005 | Koch | |
| 7,012,434 B2 | 3/2006 | Koch | |
| 7,039,534 B1 | 5/2006 | Ryno et al. | |
| 7,061,246 B2 | 6/2006 | Dougherty et al. | |
| 7,072,871 B1 | 7/2006 | Tinnemeyer | |
| 7,098,665 B2 | 8/2006 | Laig-Hoerstebrock | |
| 7,106,026 B2 * | 9/2006 | Moore | 320/104 |
| 7,109,685 B2 | 9/2006 | Tate, Jr. et al. | |
| 7,126,312 B2 | 10/2006 | Moore | |
| 7,197,487 B2 | 3/2007 | Hansen et al. | |
| 7,199,557 B2 | 4/2007 | Anbuky et al. | |
| 7,253,587 B2 | 8/2007 | Meissner | |
| 7,315,789 B2 | 1/2008 | Plett | |
| 7,321,220 B2 | 1/2008 | Plett | |
| 7,327,147 B2 | 2/2008 | Koch | |
| 7,456,612 B2 * | 11/2008 | Murakami | 320/132 |
| 7,728,599 B2 * | 6/2010 | Tae et al. | 324/433 |
| 2001/0035739 A1 | 11/2001 | Laig-Horstebrock et al. | |
| 2002/0130637 A1 | 9/2002 | Schoch | |
| 2002/0169581 A1 | 11/2002 | Sarfert | |
| 2002/0171429 A1 * | 11/2002 | Ochiai et al. | 324/426 |
| 2003/0052690 A1 | 3/2003 | Schoch | |
| 2003/0184307 A1 | 10/2003 | Kozlowski et al. | |
| 2004/0000892 A1 | 1/2004 | Jae-Seung | |
| 2004/0032264 A1 * | 2/2004 | Schoch | 324/426 |
| 2004/0189248 A1 * | 9/2004 | Boskovitch et al. | 320/116 |
| 2004/0189257 A1 | 9/2004 | Dougherty et al. | |
| 2005/0001627 A1 | 1/2005 | Anbuky et al. | |
| 2005/0035742 A1 | 2/2005 | Koo et al. | |
| 2005/0046388 A1 | 3/2005 | Tate, Jr. et al. | |
| 2005/0057255 A1 * | 3/2005 | Tate et al. | 324/426 |
| 2005/0083014 A1 * | 4/2005 | Baumgartner | 320/116 |
| 2005/0100786 A1 | 5/2005 | Ryu et al. | |
| 2005/0127874 A1 | 6/2005 | Lim et al. | |
| 2005/0194936 A1 | 9/2005 | Cho | |
| 2006/0097698 A1 | 5/2006 | Plett | |
| 2006/0100833 A1 | 5/2006 | Plett | |
| 2006/0111854 A1 | 5/2006 | Plett | |
| 2006/0111870 A1 | 5/2006 | Plett | |
| 2007/0035307 A1 | 2/2007 | Schoch | |
| 2007/0046292 A1 | 3/2007 | Plett | |
| 2007/0103120 A1 | 5/2007 | Plett | |
| 2007/0120533 A1 | 5/2007 | Plett | |
| 2007/0170889 A1 * | 7/2007 | Ishikawa et al. | 320/116 |
| 2007/0188143 A1 | 8/2007 | Plett | |
| 2007/0236182 A1 | 10/2007 | Plett | |
| 2008/0094035 A1 | 4/2008 | Plett | |

OTHER PUBLICATIONS

"Advances in EKF SOC Estimation for LiPB HEV Battery Packs" Gregory L. Plett; Powering Sustainable Transportation EVS 20; Nov. 15-19, 2003; Long Beach, California; pp. 1-12.

"An Introduction to the Kalman Filter" Greg Welch and Gary Bishop; SIGGRAPH 2001 Course 8; Los Angeles, California; Aug. 12-17, 2001; http://info.acm.org/pubs/toc/CRnotice.html; pp. 1-80.

"Dual Extended Kalman Filter Methods" Eric A. Wan and Alex T. Nelson; Kalman Filtering and Neural Networks; 2001; pp. 123-173.

"Estimation from Lossy Sensor Data: Jump Linear Modeling and Kalman Filtering" A.K. Fletcher, S. Rangen, V.K. Goyal; IPSN Apr. 26-27, 2004; Berkeley, California; pp. 251-258.

"Extended Kalman Filtering for Battery Management Systems of LiPB-based HEV Battery Packs—Part 1 Background" Gregory L. Plett; Journal of Power Sources 134; 2004; pp. 252-261; no month.

"Extended Kalman Filtering for Battery Management Systems of LiPB-based HEV Battery Packs—Part 2 Modeling and Identification" Gregory L Plett; Journal of Power Sources 134; 2004; pp. 262-276; no month.

"Extended Kalman Filtering for Battery Management Systems of LiPB-based HEV Battery Packs—Part 3 State and Parameter Estimation" Gregory L Plett; Journal of Power Sources 134; 2004; pp. 277-283; no month.

"Kalman-Filter SOC Estimation for LiPB HEV Cells" Gregory L. Plett; The 19th International Battery, Hybrid and Fuel Electric Vehicle Symposium and Exhibition; Oct. 19-23, 2002; Busan, Korea: pp. 1-12.

"LiPB Dynamic Cell Models for Kalman-Filter SOC Estimation" Gregory L. Plett; The 19th International Battery, Hybrid and Fuel Electric Vehicle Symposium and Exhibition; Oct. 19-23, 2002; Busan, Korea: pp. 1-12.

"Recursive Parameter Estimation" S.C. Rutan; Journal of Chemometrics, vol. 4, 102-121 (1990).

"Support Vector based Battery sate of charge Estimator" T. Hansen, C. Wang; Journal of Power Sources, 2004; 6391; pp. 1-8.

* cited by examiner

SYSTEM, METHOD, AND ARTICLE OF MANUFACTURE FOR DETERMINING AN ESTIMATED BATTERY CELL MODULE STATE

BACKGROUND OF THE INVENTION

Batteries are used in a wide variety of electronic and electrical devices. It is desirable to be able to estimate the internal state of a battery, including a state-of-charge (SOC), a resistance, or a total capacity.

To estimate the states of battery cells in a battery pack, a rather complex algorithm has been executed for each battery cell in the battery pack to determine the individual state of each battery cell, without taking into account an estimated battery pack state. As a result, a relatively large amount of computational tasks must be performed to determine the states of the individual battery cells in the battery pack.

Accordingly, the inventor herein has recognized a need for an improved method for more efficiently determining an estimated battery cell module state.

BRIEF DESCRIPTION OF THE INVENTION

A method for determining an estimated battery cell module state indicative of a state of a battery cell module of a battery pack in accordance with an exemplary embodiment is provided. The method includes measuring at least one of a battery cell module voltage, a battery cell module current, and a battery cell module temperature. The method further includes determining the estimated battery cell module state of the battery cell module at a predetermined time based on an estimated battery pack state and at least one of the battery cell module voltage, the battery cell module current, and the battery cell module temperature. The method further includes storing a vector corresponding to the estimated battery cell module state in a memory.

A system for determining an estimated battery cell module state indicative of a state of a battery cell module of a battery pack in accordance with another exemplary embodiment is provided. The system includes a voltage sensor electrically coupled to the battery cell module. The voltage sensor is configured to generate a first signal indicative of a battery cell module voltage. The system further includes a current sensor electrically coupled to the battery cell module. The current sensor is configured to generate a second signal indicative of a battery cell module current. The system further includes a temperature sensor disposed proximate the battery cell module. The temperature sensor is configured to generate a third signal indicative of battery cell module temperature. The system further includes a computer configured to receive the first, second, and third signals. The computer is further configured to determine the estimated battery cell module state at the predetermined time based on an estimated battery pack state and at least one of the first, second, and third signals. The computer is further configured to store a vector corresponding to the estimated battery cell module state in a memory.

A computer readable medium having computer-executable instructions for performing a method for determining an estimated battery cell module state indicative of a state of a battery cell module of a battery pack in accordance with another exemplary embodiment is provided. The method includes determining the estimated battery cell module state of the battery cell module at a predetermined time based on an estimated battery pack state and at least one of a battery cell module voltage, a battery cell module current, and a battery cell module temperature. The method further includes storing a vector corresponding to the estimated battery cell module state in a memory.

DETAILED DESCRIPTION OF THE INVENTION

The state of an electrochemical cell, referred to herein as a battery cell, used in a battery pack is defined as a set of values that may be used along with a mathematical description (called a "battery cell model") of battery cell electrochemical properties to predict its input-output characteristics at some point of time. For example, given a battery state and a battery cell current, one could predict a battery cell voltage. Alternately, given a battery state and a battery cell voltage, one could predict a battery cell current.

Battery cell modules are built by electrically connecting together one or more battery cells. A wide variety of configurations are possible, but those that are most commonly used connect battery cells either in parallel, in series, or both. For simplicity of discussion, it will be assumed that battery cells are connected together in series, although those skilled in the art will recognize that the methodologies described herein are applicable for any battery cell module configuration. For a predetermined battery cell module configuration, a mathematical model of battery cell module input-output characteristics may be generated using a predetermined battery cell model.

Battery packs are built by electrically connecting together one or more battery cell modules. A wide variety of configurations are possible, but those that are most commonly used connect battery cell modules either in parallel, in series, or both. For simplicity of discussion, it will be assumed that battery cell modules are connected together in series, although those skilled in the art will recognize that the methodologies described herein are applicable for any battery pack configuration. For a predetermined battery pack configuration, a mathematical model of battery pack input-output characteristics may be generated using the predetermined cell model or battery cell module model.

For example, battery packs have electrical characteristics that are directly related to the battery cell characteristics. In series-connected battery packs, the overall battery-pack voltage is the sum of the individual battery cell voltages, and the battery pack current is equal to the individual battery cell currents. Therefore, it is reasonable to define a battery-pack state in a similar way to a battery cell state, and example values indicative of the state of a battery pack also include (but are not limited to): state-of-charge, polarization voltages, hysteresis voltages, battery pack resistance, battery pack total capacity, polarization time constants, hysteresis levels, and an efficiency factor. If these values are properly normalized, a battery pack state can be thought of as the average of all the corresponding cell states.

The system, method, and article of manufacture disclosed herein may be used to determine estimates of values indicative of states of a plurality of battery cell modules in a battery pack in an efficient manner. A single battery pack computational algorithm (BPCA) is employed to determine the state of the overall battery pack. Further, for each of a plurality of battery cell modules in the battery pack, a single battery cell module computational algorithm (BCMCA) is utilized to determine a state of each battery cell module. The BCMCAs can be made computationally much simpler than the BPCA, and do not need to operate as frequently, resulting in reduced overall computational tasks. If a battery pack comprises N battery cell modules, computation slightly higher than 1/N times the computational tasks required by other methods is possible.

Figure 1:
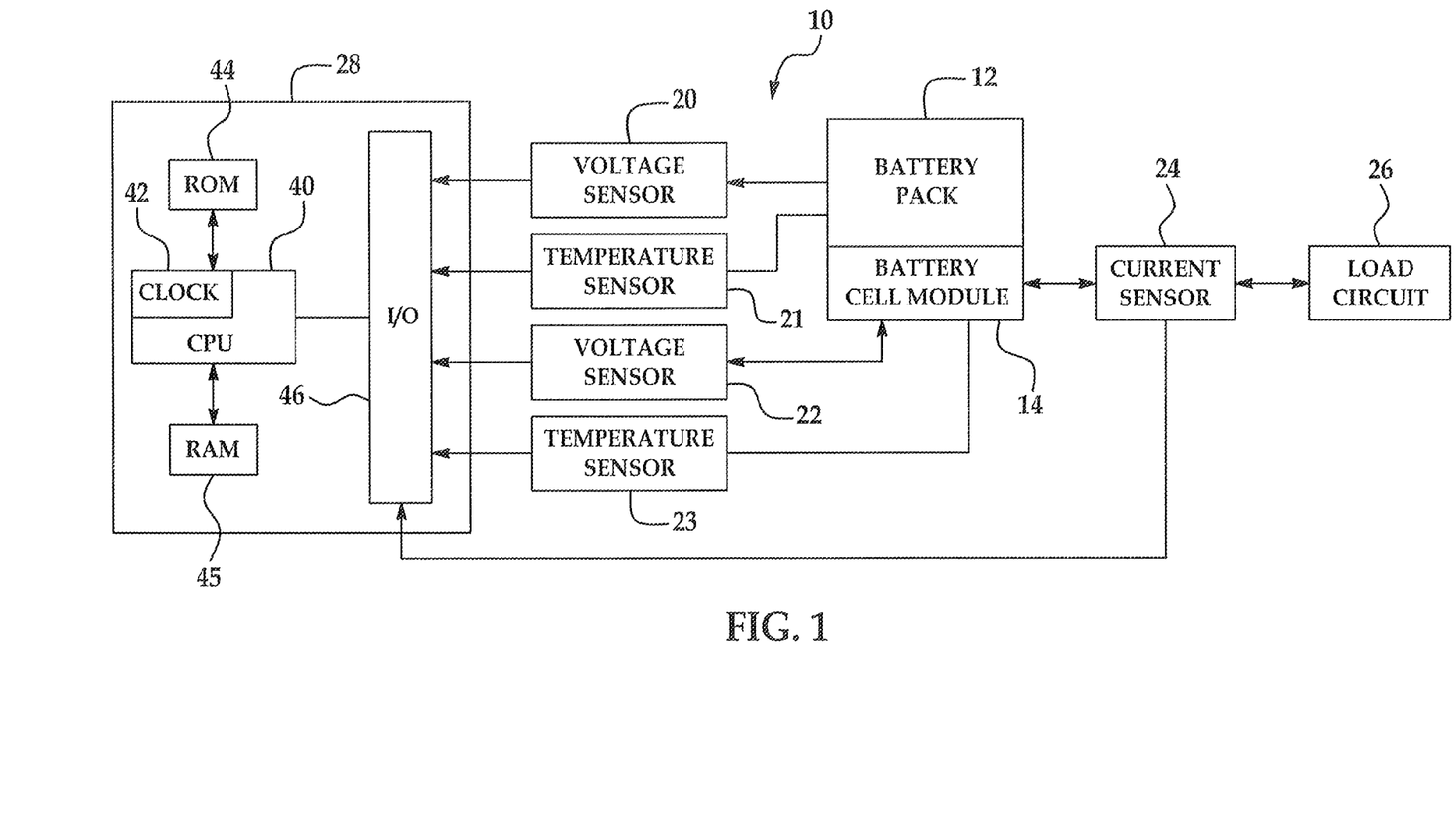
FIG. 1 is a schematic of a system for determining an estimated battery cell module state in accordance with an exemplary embodiment.

Referring to FIG. 1, a system 10 for determining an estimated battery cell module state indicative of a state of a battery cell module 14 in accordance with an exemplary embodiment is illustrated. The battery pack 12 includes at least one battery cell module 14. The battery cell module 14 can include one or more battery cells. The system 10 includes a voltage sensor 20, a temperature sensor 21, a voltage sensor 22, a temperature sensor 23, a current sensor 24, a load circuit 26, and a computer 28.

The voltage sensor 20 is provided to generate a first output signal indicative of the voltage produced by the battery pack 12. The voltage sensor 20 is electrically coupled between the I/O interface 46 of the computer 28 and the battery pack 12. The voltage sensor 20 sends the first output signal to the computer 28.

The temperature sensor 22 is provided to generate a second output signal indicative of a temperature of the battery pack 12. The temperature sensor 22 is disposed proximate the battery pack 12 and is electrically coupled to the I/O interface 46 of the computer 28. The temperature sensor 22 sends the second output signal to the computer 28.

The voltage sensor 22 is provided to generate a third output signal indicative of a voltage produced by the battery cell module 14. The voltage sensor 22 is electrically coupled between the I/O interface 46 of the computer 28 and the battery cell module 14. The voltage sensor 22 sends the third output signal to the computer 28.

The temperature sensor 23 is provided to generate a fourth output signal indicative of a temperature of the battery cell module 14. The temperature sensor 23 is disposed proximate the battery cell module 14 and is electrically coupled to the I/O interface 46 of the computer 28. The temperature sensor 23 sends the fourth output signal to the computer 28.

The current sensor 24 is provided to generate a fifth output signal indicative of a current sourced or sunk by the battery cell module 14 and of the battery pack 12. The current sensor 24 is electrically coupled between the battery pack 12 and the load circuit 26. The current sensor 24 is further electrically coupled to the I/O interface 46 of the computer 28. The current sensor 24 sends the third output signal to the computer 28.

The load circuit 26 is electrically coupled to the current sensor 24 and sinks or sources a current from the battery pack 12. The load circuit 26 comprises any electrical device that can be electrically coupled to the battery pack 12.

The computer 28 is provided for determining an estimated battery cell module state indicative of a state of the battery cell module 14 of the battery pack 12, as will be explained in greater detail below. The computer 28 includes a central processing unit (CPU) 40, a read-only memory (ROM) 44, a volatile memory such as a random access memory (RAM) 45 and an input/output (I/O) interface 46. The CPU 40 operably communicates with the ROM 44, the RAM 45, and the I/O interface 46. The CPU 40 includes a clock 42. The computer readable media including ROM 44 and RAM 46 may be implemented using any of a number of memory devices such as PROMs, EPROMs, EEPROMS, flash memory or any other electric, magnetic, optical or combination memory device capable of storing data, some of which represent executable instructions used by the CPU 40.

Figure 2:
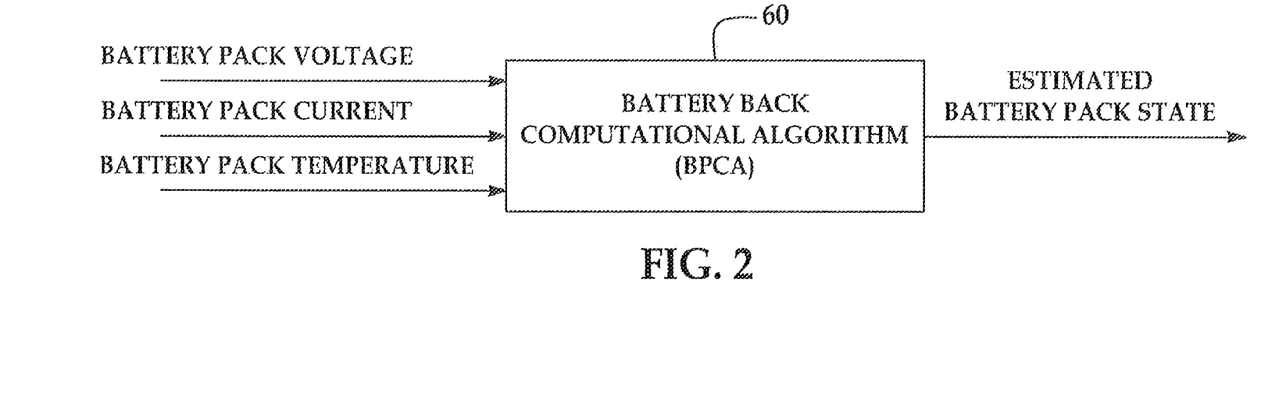
FIG. 2 is a block diagram of a battery pack computational algorithm utilized by the system of FIG. 1.

Referring to FIG. 2, a general overview of a BPCA 60 will be provided. In particular, the BPCA 60 is utilized by the computer 28 for determining the estimated battery cell module state of the battery cell module 14. The BPCA 60 outputs an estimated battery pack state, using a measured battery pack voltage, a battery pack current, and a battery pack temperature.

The system 10 utilizes one BPCA 60 to estimate as accurately as desired the overall battery pack state, comprising for example battery pack state-of-charge, polarization voltages, hysteresis voltages, battery pack resistance, battery pack total capacity, polarization time constants, hysteresis levels, and an efficiency factor. It further incorporates a plurality of BCM-CAs: one BCMCA per battery cell module for which a battery cell module state estimate is desired. The input to each BCMCA is the estimated battery pack state produced by the BPCA 60, as well as at least one of a battery cell module voltage, a battery cell module current, and a battery cell module temperature. The output from each BCMCA is an estimate of a desired value indicative of battery cell module state.

In an exemplary embodiment, the BPCA 60 estimates the following quantities indicative of the state of the battery pack 12: (i) an average battery pack state-of-charge, (ii) an average battery pack cell resistance, and (iii) an average battery pack cell inverse total capacity. In an alternative embodiment, the BPCA 60 can additionally estimate the following quantities indicative of the state of the battery pack 12: (i) two average battery pack polarization voltages, (ii) an average battery pack polarization-voltage time constant, and (iii) an average battery pack polarization voltage mixing constant, (iv) an average battery pack hysteresis voltage, and (v) a current sensor bias value.

In the exemplary embodiment, the BPCA 60 utilizes a linear Kalman filter or a nonlinear Kalman filter to estimate these quantities. An example of an extended Kalman filter that can be utilized herein, is described in U.S. Pat. No. 6,534,954, which is incorporated by reference herein in its entirety. In order to design a Kalman filter to estimate these quantities, a mathematical model of their dynamics is utilized, which is written in a "state space" form. One vector equation (i.e., state equation) is utilized to describe how the state is affected by the input, and a second equation (i.e., output equation) is utilized to describe how the output is computed from the state. In the exemplary embodiment, the inputs include a battery pack current and a battery pack temperature, for example. Outputs include a battery pack voltage, for example.

The vector state equation for the BPCA 60 is determined by combining equations for each of the individual states. The battery pack average SOC is derived as follows. First the SOC dynamics for a given cell (i) is described utilizing the following equation (1):

$$z_k^{(i)} = z_{k-1}^{(i)} - (i_k - i_k^b)\Delta t \frac{1}{C_k^{(i)}} = z_{k-1}^{(i)} - (i_k - i_k^b)\Delta t C_{inv,k}^{(i)}, \quad (1)$$

where $z_k^{(i)}$ denotes the SOC of cell i at time index k, $i_k$ denotes the measurement of battery-pack current at time index k, $i_k^b$ denotes the bias in the battery-pack current sensor, $\Delta t$ denotes the sampling period, and $C_{inv,k}^{(i)}$ denotes the inverse of cell total capacity for cell i: $C_{inv,k}^{(i)}=1/C_k^{(i)}$.

To determine the battery pack average SOC dynamics, the N copies of equation (1) are added together—one for each cell—and then divided by N to obtain the following equation (2):

$$\frac{1}{N}\sum_{i=1}^{N} z_k^{(i)} = \frac{1}{N}\sum_{i=1}^{N} z_{k-1}^{(i)} - (i_k - i_k^b)\Delta t \frac{1}{N}\sum_{i=1}^{N} C_{inv,k}^{(i)}. \quad (2)$$

The equation (2) can be expressed as equation (3):

$$\bar{z}_k = \bar{z}_{k-1} - (i_k - i_k^b)\Delta t \bar{C}_{inv,k}, \quad (3)$$

where $\bar{z}_k$ is the battery pack average SOC at time index k, and $\bar{C}_{inv,k}$ denotes the battery pack average cell inverse capacity.

Similarly, the battery pack average polarization voltage dynamics is defined utilizing the following equation:

$$\bar{f}_k = A_f \bar{f}_{k-1} + B_f(i_k - i_k^b),$$

where $\bar{f}_k$ are the average polarization voltages at time index k, $A_f$ is a constant matrix containing polarization time constants $\alpha_k$, and $B_f$ is a constant predetermined input matrix.

The battery pack average hysteresis dynamics is defined utilizing the following equation:

$$\bar{h}_k = \exp(-|(i_k - i_k^b)\gamma \Delta t \bar{C}_{inv,k}|)\bar{h}_{k-1} + (1 - \exp(-|(i_k - i_k^b)\gamma \Delta t \bar{C}_{inv,k}|))sgn(i_k - i_k^b),$$

where $\bar{h}_k$ is the relative hysteresis level at time index k, and $\gamma$ is a hysteresis rate constant.

The remaining values indicative of the state of the battery pack 40 are relatively slowly changing, and are modeled as constants which can be modified by a noise process:

$$\alpha_k = \alpha_{k-1} + n_k^\alpha$$

$$\bar{R}_k = \bar{R}_{k-1} + n_k^{\bar{R}}$$

$$\bar{C}_{inv,k} = \bar{C}_{inv,k-1} + n_k^{\bar{C}_{inv}}$$

$$G_k = G_{k-1} + n_k^G$$

$$i_k^b = i_{k-1}^b + n_k^{ib}$$

where $\alpha_k$ is a polarization time constant, $\bar{C}_{inv,k}$ is the battery pack average cell inverse capacity, $\bar{R}_k$ is the battery pack average cell resistance, and $G_k$ is a polarization-voltage blending constant, and the variables denoted as $n_k$ with some superscript denote the modeled noises.

The foregoing state equations may be combined to make a single vector state equation (4) for the BPCA 60:

$$\bar{z}_k = \bar{z}_{k-1} - (i_k - i_k^b)\Delta t \bar{C}_{inv,k}$$

$$\bar{f}_k = A_f \bar{f}_{k-1} + B_f(i_k - i_k^b),$$

$$\bar{h}_k = \exp(-|(i_k - i_k^b)\gamma \Delta t \bar{C}_{inv,k}|)\bar{h}_{k-1} + (1 - \exp(-|(i_k - i_k^b)\gamma \Delta t \bar{C}_{inv,k}|))sgn(i_k - i_k^b),$$

$$\alpha_k = \alpha_{k-1} + n_k^\alpha$$

$$\bar{R}_k = \bar{R}_{k-1} + n_k^{\bar{R}}$$

$$\bar{C}_{inv,k} = \bar{C}_{inv,k-1} + n_k^{\bar{C}_{inv}}$$

$$G_k = G_{k-1} + n_k^G$$

$$i_k^b = i_{k-1}^b + n_k^{ib} \quad (4)$$

or, $x_k = f(x_{k-1}, u_{k-1}, w_{k-1})$ where $x_k = [\bar{z}_k, \bar{f}_k^T, \bar{h}_k, \alpha_k^T, \bar{R}_k^T, \bar{C}_{inv,k}, G_k^T, i_k^b]^T$, $u_{k-1} = i_{k-1}$, $w_{k-1}$ is a random vector defining the noise processes, and f( ) is a vector function comprising all of the individual elements in equation (4).

The output equation for the BPCA 60 is defined utilizing the following equation (5):

$$\bar{y}_k = OCV(\bar{z}_k) + G_k \bar{f}_k - \bar{R}_k(i_k - i_k^b) + M\bar{h}_k + v_k, \quad (5)$$

where $\bar{y}_k$ is the battery pack voltage, OCV( ) is the cell's open-circuit-voltage as a function of SOC, M is the maximum hysteresis level, and $v_k$ represents voltage-sensor measurement noise. The equation (5) can be represented in the more general form $y_k = h(x_k, u_k, v_k)$ where, in this representation $y_k = \bar{y}_k$ is the output of the cell, $x_k$ is the state of the cell (as defined above), $u_k = i_k$, and $v_k$ is a random vector defining the noise.

Figure 3:
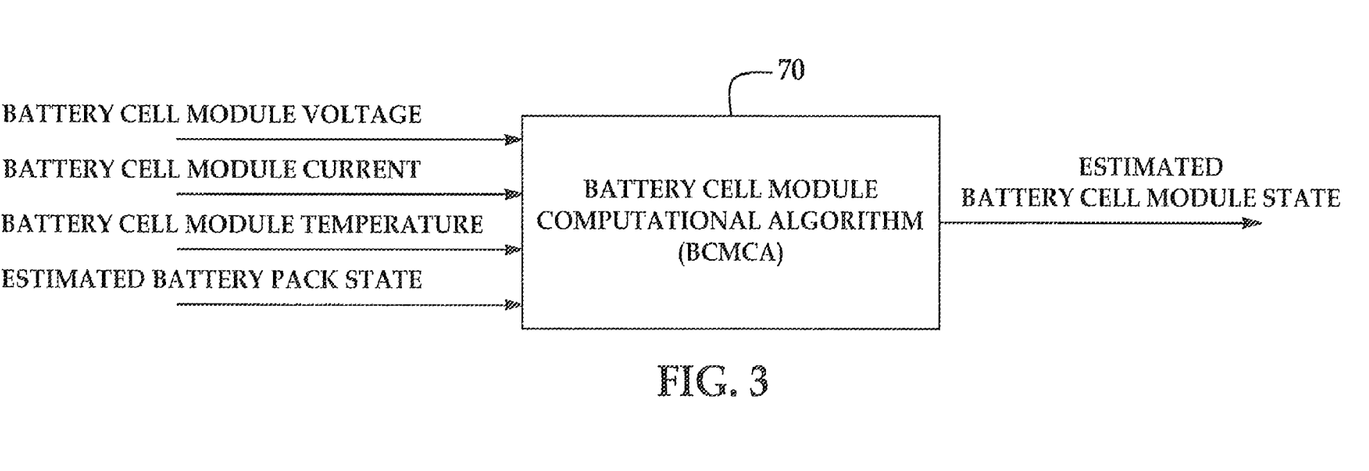
FIG. 3 is a block diagram of a battery cell module computational algorithm utilized by the system of FIG. 1.

Those skilled in the art of Kalman filter design can utilize equation (4) and equation (5) to develop the BPCA 60 that continuously outputs a battery state estimate for use by the BCMCA 70. The exemplary embodiment for the BPCA 60 is a sigma-point Kalman filter, listed in Table 1, with parameters $\gamma = \sqrt{3}$, $\alpha_0^{(m)} = \alpha_0^{(c)} = 1 - L/3$ and $\alpha_k^{(m)} = \alpha_k^{(c)} = 1/6$, where L is the length of $x_k^a$. Further, in alternative embodiments, these equations can be modified to account for other input variables, such as battery pack temperature. Further, in an alternative embodiment, another form of BPCA could be utilized instead of a Kalman filter.

An overview of the method for estimating a battery cell module state will now be described. Initially, the system 10 measures a battery cell module voltage, a battery cell module current, and a battery cell module temperature. The computer 28 determines the estimated battery cell module state of the battery cell module at a predetermined time based on an estimated battery pack state and at least one of the battery cell module voltage, the battery cell module current, and the battery cell module temperature. Further, the computer 28 stores a vector corresponding to the estimated battery cell module state in the memory 45.

Referring to FIG. 3, a general overview of the battery cell module computational algorithm (BCMCA) 70 will be provided. The method described herein utilizes one BPCA 60 and a plurality of BCMCA 70 to produce desired estimates of battery cell module states. The inventor herein has recognized that it is not necessary to estimate all of the possible values indicative of a state of a battery cell module for all battery cell modules in the battery pack 12. For example, it may be desirable to only estimate the state-of-charge of some of the battery cell modules, or the resistance value of some of the battery cell modules, or the capacity value of some of the battery cell modules. Further, the BCMCA 70 is defined in a way that the quantities that it estimates directly change relatively slowly and so the BCMCA 70 does not need to be executed as frequently as the BPCA 60 in order to maintain accurate estimates.

In an exemplary embodiment, the BCMCA 70 receives as an input an estimated battery pack state, a battery cell module voltage, a battery cell module current, and a battery cell module temperature. The BCMCA 70 produces as an output an estimate of battery cell module SOC, battery cell module resistance, and battery cell module capacity.

The BCMCA 70 uses a two-step process to compute an estimated battery cell module state. It first estimates a difference between the battery pack state and the cell module state. Secondly, it adds the estimated battery pack state to this difference to compute an estimated battery cell module state. The quantities estimated in the first step (the difference between the battery pack state and the cell module state) change relatively slowly in a battery pack. Therefore, the BCMCA 70 does not need to be executed as frequently as a BPCA 60 and therefore requires fewer computations.

In an exemplary embodiment, the first step performed by the BCMCA 70 estimates a difference between a SOC of a battery cell module and the average battery pack SOC, the difference between the inverse total capacity of the battery cell module and the battery pack inverse total capacity, and the difference between the resistance of the battery cell module and the average battery pack resistance. Then, the BCMCA 70 computes the estimated battery cell module state by adding these difference values to the estimated battery pack state. That is, it computes the estimated battery cell module SOC by adding the battery pack average SOC to the estimate of the difference between the battery pack average SOC and the battery cell module SOC. It computes the estimated battery cell module resistance by adding the battery pack average resistance to the estimate of the difference between the battery pack average resistance and the battery cell module resistance. It computes the estimated battery cell module capacity inverse by adding the battery pack average capacity inverse to the estimate of the difference between the battery pack capacity inverse and the battery cell module capacity inverse: it then computes the estimated battery cell module capacity as one divided by the estimated battery cell module capacity inverse.

In an exemplary embodiment, each BCMCA 70 utilizes a linear Kalman filter or a nonlinear Kalman filter for each quantity that will be estimated. Therefore, a state equation and an output equation for each quantity that will be estimated is initially determined. The state equation and the output equation for the BCMCA 70 will be described in subsections, below. It should be noted that the term "Delta" is used to indicate the difference between a battery cell module state value and a corresponding average battery pack state value. For example, "Delta-SOC" indicates a difference between a battery cell module SOC state and a battery-pack SOC state. In the notation that follows, the Greek letter Delta ($\Delta$) is used to indicate a Delta quantity. Further, the notation uses a bar (−) over a quantity to indicate that it corresponds to an average battery pack quantity. For example, $\bar{z}$ indicates average battery pack SOC.)

In an exemplary embodiment, each BCMCA 70 will estimate battery cell module SOC, battery cell module resistance, and battery cell-module capacity. Therefore, state equations and output equations are utilized for these three quantities in order to design a Kalman filter to estimate the quantities. Exemplary equations for these three quantities are described in the following paragraphs.

In order to estimate battery cell module SOC, we first define a difference between the SOC of battery cell module 40 and the average battery pack SOC as equation (6):

$$\Delta z_k^{(i)} = z_k^{(i)} - \bar{z}_k, \quad (6)$$

where $\Delta z_k^{(i)}$ is the difference between the SOC for battery cell module i and the average battery pack SOC. Then, equation (3) may be subtracted from equation (1), using the definition of equation (4) to determine the equation (7) describing the dynamics of $\Delta z_k^{(i)}$:

$$\Delta z_k^{(i)} = z_{k-1}^{(i)} - i_k \Delta t C_{inv,k}^{(i)} - \bar{z}_{k-1} + i_k \Delta t \bar{C}_{inv,k} \quad (7)$$
$$= \Delta z_{k-1}^{(i)} - i_k \Delta t \Delta C_{inv,k}^{(i)}$$

where $\Delta C_{inv,k}^{(i)} = C_{inv,k}^{(i)} - \hat{C}_{inv,k}$. Because $\Delta C_{inv,k}^{(i)}$ tends to be small, the state $\Delta z_k^{(i)}$ does not change very quickly, and can be updated at a slower rate than the battery pack average SOC, saving computation.

An output equation (8) that can be used with the Delta-SOC computation is:

$$y_k^{(i)} = OCV(\bar{z}_k + \Delta z_k^{(i)}) + G_k \bar{f}_k - (\bar{R}_k + \Delta R_k^{(i)})(i_k - i_k^b) + M \bar{h}_k + e_k. \quad (8)$$

To estimate $\Delta z_k^{(i)}$, a linear or nonlinear Kalman filter may be used with equation (7) as the state equation, and equation (8) as the output equation. Since BCMCA 70 utilizes a single-state Kalman filter, it performs the foregoing computations relatively quickly. The exemplary embodiment for the BCMCA 70 is a sigma-point Kalman filter, listed in Table 1, where the state of the filter is $x_k = \Delta z_k^{(i)}$ and the output of the filter is $y_k = y_k^{(i)}$, $\gamma = \sqrt{3}$, $\alpha_0^{(m)} = \alpha_0^{(c)} = 2/3$ and $\alpha_k^{(m)} = \alpha_k^{(c)} = 1/6$, where L is the length of $x_k$.

In order to estimate a battery cell module resistance, we first define a difference between the resistance of cell module 40 and the average battery pack resistance as $\Delta R_k^{(i)} = R_k^{(i)} - \bar{R}_k$. We then define a model of cell resistance utilizing the following two coupled equations:

$$\Delta R_{k+1}^{(i)} = \Delta R_k^{(i)} + r_k$$

$$y_k = OCV(\bar{z}_k + \Delta z_k^{(i)}) - (\bar{R}_k + \Delta R_k^{(i)}) i_k + e_k$$

where $\Delta R_k^{(i)}$ is the difference between battery pack average resistance and battery cell module resistance and is modeled as a constant value with a noise process $r_k$ allowing adaptation, $y_k$ is a crude estimate of the battery cell module's voltage, $i_k$ is the battery cell module current, and $e_k$ models estimation error. In a Delta-R KF, the model's prediction of $y_k$ and the measured value of $y_k$ are utilized by the KF to adapt $\Delta R_k^{(i)}$. It should be noted that in an alternative embodiment, different values of resistance and for charge and discharge may be easily incorporated, and more precise output equations such as equation (8) can be used. The exemplary embodiment for this aspect of the BCMCA is an extended Kalman filter, listed in Table 2, where the state of the filter is $x_k = \Delta R_k^{(i)}$ and the output of the filter is $y_k$ as given above.

In order to estimate a battery cell module capacity, we first define a difference between the capacity inverse of cell module 40 and the average battery pack capacity inverse as $\Delta C_{inv,k}^{(i)} = C_{inv,k}^{(i)} - \bar{C}_{inv,k}$. We then define a model of cell capacity inverse utilizing the following two coupled equations:

$$\Delta C_{inv,k+1}^{(i)} = \Delta C_{inv,k}^{(i)} + r_k$$

$$d_k = z_k^{(i)} - z_{k-1}^{(i)} + \eta_i i_{k-1} \Delta t (\bar{C}_{inv,k+1} + \Delta C_{inv,k-1}^{(i)}) + e_k$$

The second of these two equations is a reformulation of the SOC state equation such that the expected value of $d_k$ is equal to zero by construction. Again, a Kalman Filter is constructed using the model defined by these two equations to produce a capacity estimate. As the Kalman Filter operates, the computation for $d_k$ in the second equation is utilized by the KF to update the capacity inverse estimate. The exemplary embodiment for this aspect of the BCMCA is an extended Kalman filter, listed in Table 2, where the state of the filter is $x_k = \Delta C_{inv,k}^{(i)}$ and the output of the filter is $y_k = d_k$ as given above.

The output of a BCMCA is computed by combining the average battery pack state with the battery cell module Delta states produced by the individual Kalman filters operating within the BCMCA:

$$z_k^{(i)} = \bar{z}_k + \Delta z_k^{(i)}$$

$$R_k^{(i)} = \bar{R}_k + \Delta R_k^{(i)}$$

$$C_k^{(i)} = \frac{1}{\overline{C}_{inv,k} + \Delta C_{inv,k}^{(i)}}$$

It should be noted that one desirable feature of the BCMCA has been defined by the foregoing equations. Although the battery pack state may change rapidly, the difference between any battery cell module state and the battery pack average state changes very slowly. With this understanding, it is apparent that the BPCA needs to be executed frequently, but the BCMCA internal filters need be executed much less frequently. To illustrate, if a pack comprises N battery cell modules in series, other techniques to estimate battery pack state require ongoing computation proportional to N every time step. The system 10 disclosed herein, however, only utilizes a single BPCA and NBCMCAs which are both computationally much simpler than the BPCA and also need to execute less frequently than the BPCA. Therefore, the computational tasks implemented by the system 10 can approach 1/N times the computational tasks utilized by other methods and still produce accurate estimates of the desired battery cell module states.

The system, the method, and the article of manufacture for determining an estimated battery cell module state provide a substantial advantage over other systems and methods. In particular, the system, method, and article of manufacture provide a technical effect of accurately determining an estimated battery cell module state.

The above-described methods can be embodied in the form of computer program code containing instructions embodied in tangible media, such as floppy diskettes, CD ROMs, hard drives, or any other computer-readable storage medium, wherein, when the computer program code is loaded into and executed by a computer, the computer becomes an apparatus for practicing the invention. The above-described methods can also be embodied in the form of computer program code, for example, whether stored in a storage medium, loaded into and/or executed by a computer, or transmitted over some transmission medium, loaded into and/or executed by a computer, or transmitted over some transmission medium, such as over electrical wiring or cabling, through fiber optics, or via electromagnetic radiation, wherein, when the computer program code is loaded into an executed by a computer, the computer becomes an apparatus for practicing the methods. When implemented on a general-purpose microprocessor, the computer program code segments configure the microprocessor to create specific logic circuits.

While the invention is described with reference to the exemplary embodiments, it will be understood by those skilled in the art that various changes may be made and equivalent elements may be substituted for elements thereof without departing from the scope of the invention. In addition, many modifications may be made to the teachings of the invention to adapt to a particular situation without departing from the scope thereof. Therefore, it is intended that the invention not be limited the embodiments disclosed herein, but that the invention includes all embodiments falling with the scope of the appended claims. Moreover, the use of the terms first, second, etc. does not denote any order of importance, but rather the terms first, second, etc. are used to distinguish one element from another.

TABLE I

NONLINEAR SIGMA-POINT KALMAN FILTER.

State-space model:
$x_k = f(x_{k-1}, u_{k-1}, w_{k-1})$
$y_k = h(x_k, u_k, v_k)$,
where $x_k$ is a state equation and $y_k$ is an output equation, $w_k$ and $v_k$ are independent, zero-mean, Gaussian noise processes of covariance matrices $\Sigma_w$ and $\Sigma_v$, respectively.
Definitions:
$x_k^a = [x_k^T, w_k^T, v_k^T]^T, X_k^a = [(X_k^x)^T, (X_k^w)^T, (X_k^v)^T]^T, p = 2 \times \dim(x_k^a)$.
Initialization. For k = 0, set $$\hat{x}_0^+ = E[x_0] \qquad \hat{x}_0^{a,+} = E[x_0^a]$$

$$\sum_{\tilde{x},0}^+ = E\left[(x_0 - \hat{x}_0^+)(x_0 - \hat{x}_0^+)^T\right] \qquad \sum_{\tilde{x},0}^{a,+} = E\left[(x_0^a - \hat{x}_0^{a,+})(x_0^a - \hat{x}_0^{a,+})^T\right]$$

$$= \mathrm{diag}\left(\sum_{\tilde{x},0}^+, \sum_w, \sum_v\right).$$

Computation: For k = 1, 2, ..., compute:

State estimate time update:

$$X_{k-1}^{a,+} = \left\{\hat{x}_{k-1}^{a,+}, \hat{x}_{k-1}^{a,+} + \gamma\sqrt{\sum_{\tilde{x},k-1}^{a,+}}, \hat{x}_{k-1}^{a,+} - \gamma\sqrt{\sum_{\tilde{x},k-1}^{a,+}}\right\}.$$

$$X_{k,i}^{x,-} = f(X_{k-1,i}^{x,+}, u_{k-1}, X_{k-1,i}^{w,+}).$$

$$\hat{x}_k^- = \sum_{i=0}^p \alpha_i^{(m)} X_{k,i}^{x,-}.$$

Error covariance time update:

$$\sum_{\tilde{x},k}^- = \sum_{i=0}^p \alpha_i^{(c)}(X_{k,i}^{x,-} - \hat{x}_k^-)(X_{k,i}^{x,-} - \hat{x}_k^-)^T.$$

TABLE I-continued

NONLINEAR SIGMA-POINT KALMAN FILTER.

Output estimate:
$$Y_{k,i} = h(X_{k,i}^{x,-}, u_k, X_{k-1,i}^{v,+}).$$

$$\hat{y}_k = \sum_{i=0}^{p} \alpha_i^{(m)} Y_{k,i}.$$

Estimator gain matrix
$$\sum_{\hat{y},k} = \sum_{i=0}^{p} \alpha_i^{(c)} (Y_{k,i} - \hat{y}_k)(Y_{k,i} - \hat{y}_k)^T.$$

$$\sum_{\tilde{x}\tilde{y},k} = \sum_{i=0}^{p} \alpha_i^{(c)} (X_{k,i}^{x,-} - \hat{x}_k^-)(Y_{k,i} - \hat{y}_k)^T.$$

$$L_k = \sum_{\tilde{x}\tilde{y},k} \sum_{\tilde{y},k}^{-1}.$$

State estimate measurement update: $\hat{x}_k^+ = \hat{x}_k^- + L_k[y_k - \hat{y}_k].$ Error covariance meas. update:
$$\sum_{\tilde{x},k}^{+} = \sum_{\tilde{x},k}^{-} - L_k \sum_{\tilde{y},k} L_k^T.$$

In Table I, the following variables, symbols, and notation are used (in addition to those defined elsewhere):

- Superscript "+": Indicative of an estimated quantity at time index k, using all measured data available at or before time index k.
- Superscript "−": Indicative of a predicted quantity at time index k, using all measured data available at or before time index k−1.
- Superscript "a": Indicative of an augmented state of the dynamic system at time index k, where the augmented state comprises system state $x_k$, state noise $w_k$, and sensor noise $v_k$.
- Subscript "i" on a sigma-point set: Indicative of the ith member of that set.
- $X_k^a$: Set of sigma points of augmented state at time index k, capturing mean and covariance of augmented state.
- $X_k^x$: Set of sigma points of state at time index k, capturing mean and covariance of state.
- $X_k^w$: Set of sigma points of process noise at time index k, capturing mean and covariance of process noise.
- $X_k^v$: Set of sigma points of sensor noise at time index k, capturing mean and covariance of sensor noise.
- $Y_k$: Set of sigma points of predicted output value at time index k, capturing mean and covariance of predicted output, used internally by algorithm.
- E[ ]: Function returning statistical expected value of its argument.
- $\sqrt{}$: Matrix square root, computed using a Cholesky decomposition.
- $\hat{x}_k^+$: State estimate at time index k: an output of the algorithm (e.g., vector of estimated battery cell module state).
- $\hat{x}_k^{a,+}$: Estimate of augmented state at time index k.

$\sum_{\tilde{x},k}^{+}$ : Error covariance of state estimate at time index k.

$\sum_{\tilde{x},k}^{a,+}$ : Error covariance of augmented state estimate at time index k.

- $\hat{x}_k^-$: A-priori predicted value of state at time index k.

$\sum_{\tilde{x},k}^{-}$ : Error covariance of state prediction time index k.

- $\hat{y}_k$: Predicted value of output at time index k.
- $y_k$: Measured value of output at time index k.

$\sum_{\tilde{y},k}$ : Error covariance of output prediction at time index k.

$\sum_{\tilde{x}\tilde{y},k}^{-}$ : Error cross-covariance between state and output prediction at time index k.

- $L_k$: Estimator gain matrix at time index k.
- γ: Algorithm parameter (set to $\sqrt{3}$ in exemplary embodiment).
- $\alpha_i^{(m)}$: Set of weighting factors used when computing mean state and mean output estimates and predictions.

$\alpha_i^{(c)}$: Set of weighting factors used when computing the error covariance of state and output estimates and predictions.

TABLE II

NONLINEAR EXTENDED KALMAN FILTER.

State-space model:
$x_k = f(x_{k-1}, u_{k-1}, w_{k-1})$
$y_k = h(x_k, u_k, v_k)$,
where $x_k$ is a state equation and $y_k$ is an output equation, $w_k$ and $v_k$ are independent Gaussian noise processes with means $\overline{w}_k$ and $\overline{v}_k$, respectively, and covariance matrices $\Sigma_w$ and $\Sigma_v$, respectively.

Definitions:

$$\hat{A}_k = \frac{\partial f(x_k, u_k, w_k, k)}{\partial x_k}\bigg|_{x_k=\hat{x}_k^+} \quad \hat{B}_k = \frac{\partial f(x_k, u_k, w_k, k)}{\partial w_k}\bigg|_{w_k=\overline{w}_k}$$

$$\hat{C}_k = \frac{\partial h(x_k, u_k, v_k, k)}{\partial x_k}\bigg|_{x_k=\hat{x}_k^-} \quad \hat{D}_k = \frac{\partial h(x_k, u_k, v_k, k)}{\partial v_k}\bigg|_{v_k=\overline{v}_k}$$

Initialization: For k = 0, set
$\hat{x}_0^+ = E[x_0]$ $$\sum_{\tilde{x},0}^{+} = E\big[(x_0 - \hat{x}_0^+)(x_0 - \hat{x}_0^+)^T\big].$$

Computation: For k = 1, 2, ..., compute:

State estimate time update: $\hat{x}_k^- = f(\hat{x}_{k-1}^+, u_{k-1}, \overline{w}_{k-1})$.

Error covariance time update:
$$\sum_{\tilde{x},k}^{-} = \hat{A}_{k-1}\sum_{\tilde{x},k-1}^{+}\hat{A}_{k-1}^T + \hat{B}_{k-1}\sum_{w}\hat{B}_{k-1}^T.$$

Output estimate: $\hat{y}_k = h(\hat{x}_k^-, u_k, \overline{v}_k)$.

Estimator gain matrix:
$$L_k = \sum_{\tilde{x},k}^{-}\hat{C}_k^T\bigg[\hat{C}_k\sum_{\tilde{x},k}^{-}\hat{C}_k^T + \hat{D}_k\sum_{v}\hat{D}_k^T\bigg]^{-1}.$$

State estimate measurement update: $\hat{x}_k^+ = \hat{x}_k^- + L_k[y_k - \hat{y}_k]$.

Error covariance measurement update:
$$\sum_{\tilde{x},k}^{+} = (I - L_k\hat{C}_k)\sum_{\tilde{x},k}^{-}.$$

In Table II, the following variables, symbols, and notation are used (in addition to those defined elsewhere):

Superscript "+": Indicative of an estimated quantity at time index k, using all measured data available at or before time index k.

Superscript "−": Indicative of a predicted quantity at time index k, using all measured data available at or before time index k−1.

$\hat{A}_k, \hat{B}_k, \hat{C}_k, \hat{D}_k$: Matrices indicative of a linearization of the functions f( ) and h( ) at time index k.

E[ ]: Function returning statistical expected value of its argument.

$\hat{x}_k^+$: State estimate at time index k: an output of the algorithm (e.g., vector of estimated battery cell module state).

$\sum_{\tilde{x},k}^{+}$: Error covariance of state estimate at time index k: an output of the algorithm.

$\hat{x}_k^-$: A-priori predicted value of state at time index k.

$\sum_{\tilde{x},k}^{-}$: Error covariance of state predication at time index k.

$\hat{y}_k$: Predicted value of output at time index k.

$L_k$: Estimator gain matrix at time index k.

What is claimed is:

1. A method for determining an estimated battery cell module state of a first battery cell module of a battery pack, comprising:

measuring at least one of a battery cell module voltage utilizing a voltage sensor, a battery cell module current utilizing a current sensor, and a battery cell module temperature utilizing a temperature sensor, the battery cell module voltage and the battery cell module current and the battery cell module temperature being associated with the first battery cell module of a plurality of battery cell modules in the battery pack;

determining the estimated battery cell module state of the first battery cell module at a predetermined time based on an estimated battery pack state associated with the battery pack having the plurality of battery cell modules, and at least one of the battery cell module voltage, the battery cell module current, and the battery cell module temperature, utilizing a computer; and storing a vector corresponding to the estimated battery cell module state in a memory of the computer;

wherein determining the estimated battery cell module state includes determining difference value representing a difference between the estimated battery cell module state and the estimated battery pack state based on at least one of the battery cell module voltage, the battery cell module current, and the battery cell module temperature, utilizing the computer, and determining the estimated battery cell module state by adding the estimated battery pack state to the difference value utilizing the computer;

wherein determining the difference value representing the difference between the estimated battery cell module state and the estimated battery pack state is performed using one of a linear Kalman filter and a nonlinear Kalman filter;

wherein determining the difference value representing the difference between the battery cell module state and the estimated battery pack state is performed less frequently than determining the estimated pack state;

wherein the first battery cell module comprises a plurality of electrochemical cells.

2. The method of claim 1, wherein the estimated battery pack state is determined using one of a linear Kalman filter and a nonlinear Kalman filter.

3. A method for determining an estimated battery cell module state of a first battery cell module of a battery pack, comprising:

measuring at least one of a battery cell module voltage utilizing a voltage sensor, a battery cell module current utilizing a current sensor, and a battery cell module temperature utilizing a temperature sensor, the battery cell module voltage and the battery cell module current and the battery cell module temperature being associated with the first battery cell module of a plurality of battery cell modules in the battery pack;

determining a difference value representing a difference between the estimated battery cell module state and the estimated battery pack state based on at least one of the battery cell module voltage, the battery cell module current, and the battery cell module temperature, utilizing a computer, wherein determining the difference value is performed less frequently than determining the estimated battery pack state;

determining the estimated battery cell module state by adding the estimated battery pack state to the difference value, utilizing the computer; and storing a vector corresponding to the estimated battery cell module state in a memory of the computer.

4. The method of claim 3, where determining the difference value representing the difference between the estimated battery cell module state and the estimated battery pack state is performed using one of a linear Kalman filter and a nonlinear Kalman filter.

5. The method of claim 3, wherein the estimated battery pack state is determined using one of a linear Kalman filter and a nonlinear Kalman filter.

6. A method for determining an estimated battery cell module state of charge of a first battery cell module of a battery pack, comprising:

measuring at least one of a battery cell module voltage utilizing a voltage sensor, a battery cell module current utilizing a current sensor, and a battery cell module temperature utilizing a temperature sensor, the battery cell module voltage and the battery cell module current and the battery cell module temperature being associated with the first battery cell module of a plurality of battery cell modules in the battery pack;

determining the estimated battery cell module state of charge of the first battery cell module at a predetermined time based on an estimated battery pack average state of charge associated with the battery pack, and at least one of the battery cell module voltage, the battery cell module current, and the battery cell module temperature, utilizing a computer; and storing a vector corresponding to the estimated battery cell module state of charge in a memory of the computer.

* * * * *